(12) United States Patent
Hsieh et al.

(10) Patent No.: US 7,946,881 B2
(45) Date of Patent: May 24, 2011

(54) SOCKET ASSEMBLY WITH HEAT SINK MODULE

(75) Inventors: Wen-Yi Hsieh, Tu-Cheng (TW); Kenzo Nakao, Yokohama (JP); Shih-Wei Hsiao, Tu-Cheng (TW)

(73) Assignee: Hon Hai Precision Ind. Co., Ltd., New Taipei (TW)

( * ) Notice: Subject to any disclaimer, the term of this patent is extended or adjusted under 35 U.S.C. 154(b) by 19 days.

(21) Appl. No.: 12/609,021

(22) Filed: Oct. 30, 2009

(65) Prior Publication Data

US 2010/0291793 A1 Nov. 18, 2010

(51) Int. Cl.
*H01R 13/00* (2006.01)
(52) U.S. Cl. ........................................ 439/487; 439/331
(58) Field of Classification Search .................. 439/487, 439/330, 331
See application file for complete search history.

(56) References Cited

U.S. PATENT DOCUMENTS

| | | | |
|---|---|---|---|
| 5,186,642 A | 2/1993 | Matsuoka et al. | |
| 5,690,281 A | 11/1997 | Ikeya et al. | |
| 6,280,222 B1* | 8/2001 | Walkup | 439/331 |
| 6,354,859 B1* | 3/2002 | Barabi et al. | 439/331 |
| 6,547,580 B1* | 4/2003 | Leavitt et al. | 439/266 |
| 6,570,763 B1* | 5/2003 | McHugh et al. | 361/704 |
| 6,902,424 B2* | 6/2005 | Takayama et al. | 439/487 |
| 7,230,830 B2* | 6/2007 | Ujike et al. | 361/704 |
| 7,540,745 B2* | 6/2009 | Lin | 439/73 |
| 7,559,784 B2* | 7/2009 | Hsiao et al. | 439/331 |
| 7,566,237 B2* | 7/2009 | Gattuso et al. | 439/331 |
| 7,588,450 B2* | 9/2009 | Hsiao et al. | 439/259 |
| 7,632,128 B2* | 12/2009 | Lin et al. | 439/331 |
| 7,666,021 B2* | 2/2010 | Ma | 439/331 |
| 7,785,124 B2* | 8/2010 | Lin et al. | 439/330 |
| 7,803,006 B2* | 9/2010 | Lin | 439/331 |
| 7,824,188 B2* | 11/2010 | Yokoyama | 439/73 |
| 7,828,576 B2* | 11/2010 | Lin et al. | 439/331 |
| 7,833,021 B2* | 11/2010 | Lin | 439/68 |
| 2007/0238327 A1* | 10/2007 | Hsu | 439/70 |
| 2008/0014780 A1* | 1/2008 | Lin | 439/331 |
| 2008/0057765 A1* | 3/2008 | Hsiao et al. | 439/259 |
| 2008/0280477 A1* | 11/2008 | Hsiao et al. | 439/331 |
| 2009/0104807 A1* | 4/2009 | Lin et al. | 439/341 |
| 2009/0291582 A1* | 11/2009 | Lin | 439/331 |
| 2010/0009558 A1* | 1/2010 | Lin et al. | 439/73 |
| 2010/0144190 A1* | 6/2010 | Yokoyama | 439/487 |
| 2010/0261371 A1* | 10/2010 | Morinari | 439/331 |
| 2010/0289513 A1* | 11/2010 | Hsieh et al. | 324/755 |
| 2010/0291793 A1* | 11/2010 | Hsieh et al. | 439/487 |
| 2010/0297861 A1* | 11/2010 | Hsieh et al. | 439/157 |

* cited by examiner

*Primary Examiner* — Ross N Gushi
(74) *Attorney, Agent, or Firm* — Andrew C. Cheng; Wei Te Chung; Ming Chieh Chang (57) ABSTRACT

A socket assembly has a socket and a heat sink module detachably mounted on the socket. The socket has a base, a sliding board mounted on the base, a lid disposed upon the base and an actuator disposed between the base and the cover. The heat sink module has a fastening frame surrounding the base, a cover pivotally assembled to an end of the fastening frame and a heat sink mounted on the cover. The cover has a latching portion which latches with a top wall of the lid when the cover rotates to a closed position. The heat sink is brought by the cover to pass an open defined on the lid and to abut against an IC package seating on the sliding board.

20 Claims, 9 Drawing Sheets

SOCKET ASSEMBLY WITH HEAT SINK MODULE

FIELD OF THE INVENTION

The present invention relates to a socket assembly, and particularly to a socket assembly in which a socket for testing an IC package is readily incorporated with a heat sink dissipating heat buildup thereof during burn-in testing of the IC package.

DESCRIPTION OF RELATED ART

Testing socket is an indispensable equipment for ensuring proper function of an IC package before it is delivered, and which is generally referred to BITS, Burn-In-Testing-Socket. A conventional BITS generally has a base, a movable board engaging with the base and a plurality of actuators which drive the movable board to move with respect to the base. The movable board is displaceable between an opened position, where a package does not electrically connect with the contacts received in the base, and a closed position, where the package electrically contacts with the contacts received in the base. Related patents refer to U.S. Pat. Nos. 5,186,642, and 5,690,281.

Figure 1:
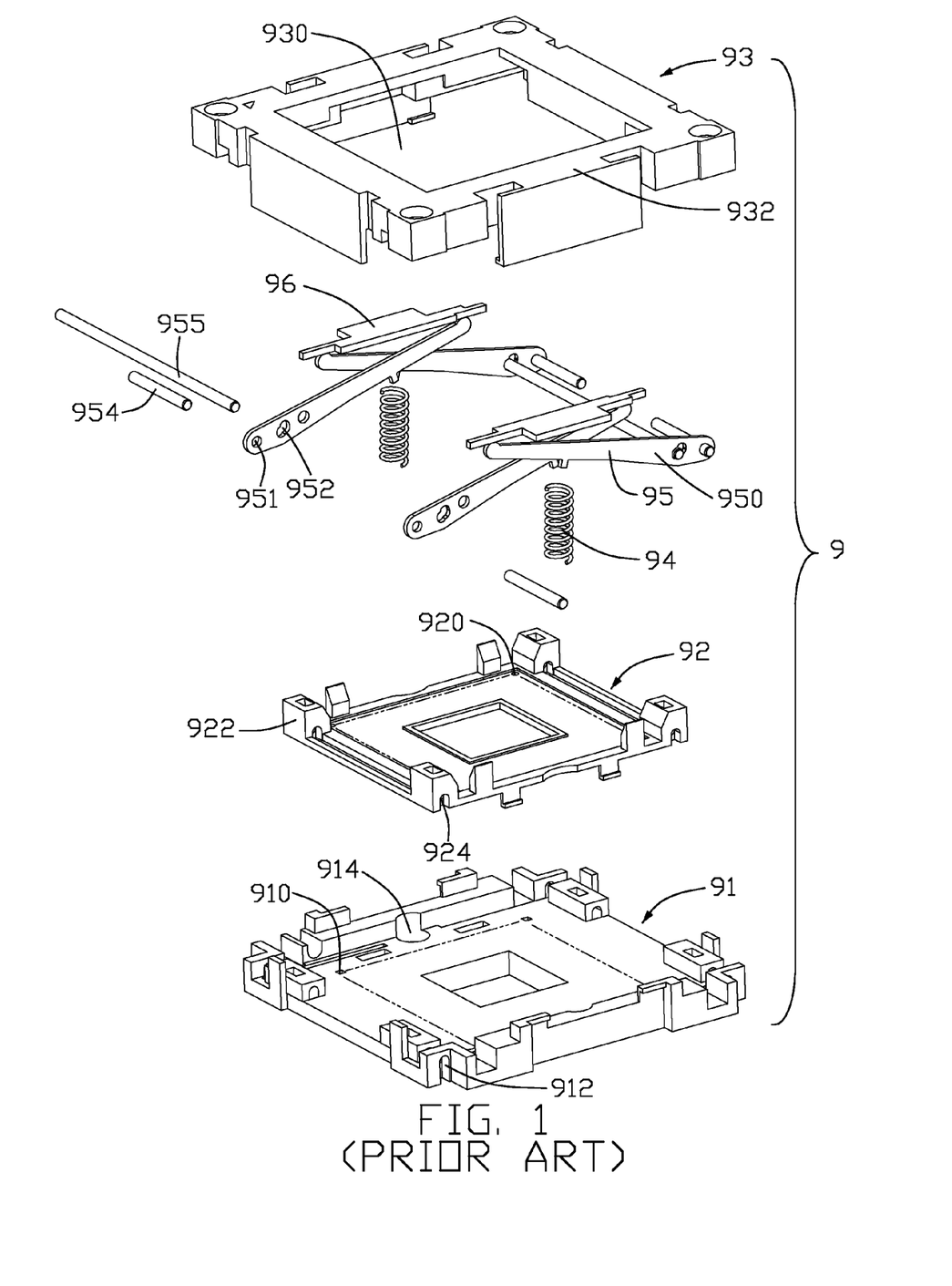
FIG. 1 is an exploded, perspective view of a related socket.

A typical socket 9 shown in FIG. 1, generally comprises an insulative housing 91, a slider 92 capable of moving with respect to the insulative housing 91, a pair of actuators 95 driving the slider 92, a pair of springs 94, an inserted board 96 and a lid 93. Each actuator 95 has a pair of urging poles 950, a pair of supporting poles 954 and a pair of transmitting poles 955; each urging pole 950 defines a receiving hole 951 and a guiding slot 952, the supporting poles 954 are received in the receiving holes 951; the transmitting poles 955 are received in the guiding slots 952. The insulative housing 91 includes a main body (not labeled) with a plurality of contact passageways 910, a plurality of contacts (not shown) received in the contact passageways 910, a pair of blind holes 914 for receiving the springs 94 therein, a pair of retaining slots 912 disposed on two opposed sides of the main body for receiving the supporting poles 954. The slider 92 has a plurality of contact slots 920 corresponding to the contact passageway 910, four protrusions 922 protruding from corners thereof, and a pair of elongate receiving slots 924 defined on two opposite sides thereof for receiving the transmitting poles 955. The rectangular lid 93 has an window 930 in a center thereof, a plurality of sidewalls 932 and a pair of receiving grooves (not shown) defined on two opposed sidewalls 932 thereof for receiving the inserted board 96.

Figure 2:
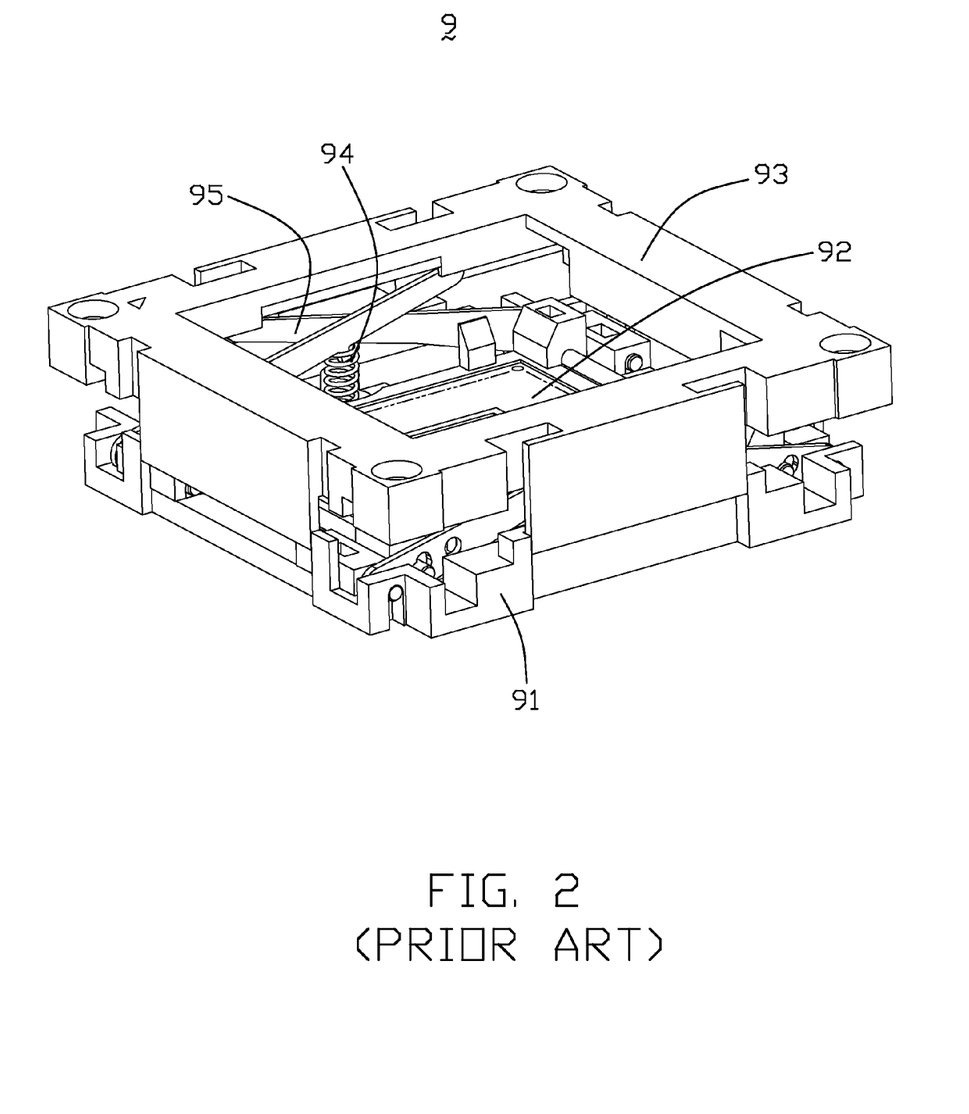
FIG. 2 is an assembled, perspective view of the related socket in FIG. 1
Figure 3:
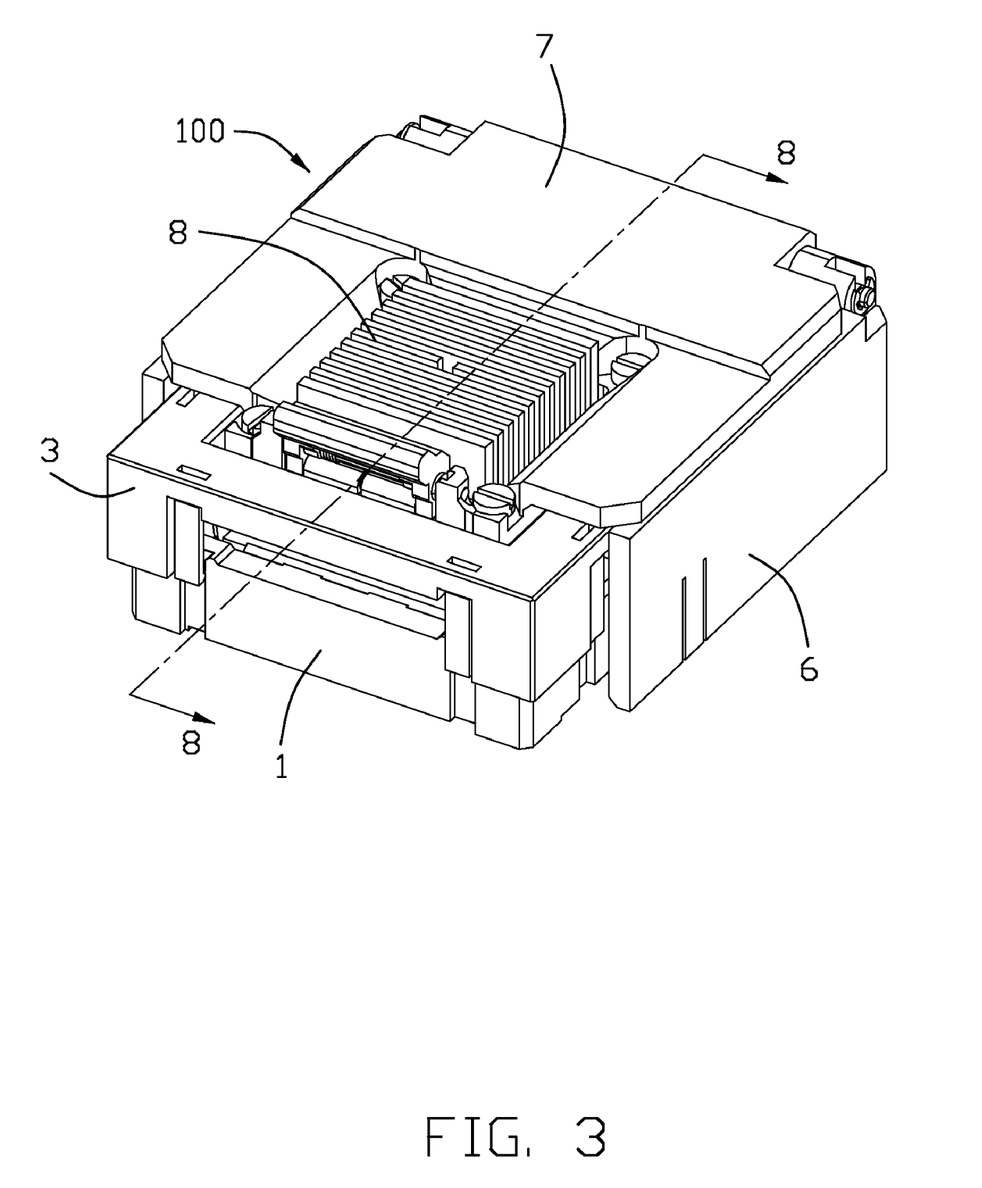
FIG. 3 is an assembled, perspective view of a socket assembly in accordance with a preferred embodiment of present invention.

Referring to FIG. 2, when the socket 9 is assembled sequentially, the slider 92 is movably assembled to the insulative housing 91, the supporting poles 954 of the actuator 95 are received in the retaining slots 912 of the insulative housing 91, the transmitting poles 955 of the actuator 95 are received in the elongated slots 924 of the slider 92, the inserted board 96 is received in the receiving grooves (not shown) of the lid 93, the springs 94 are disposed between the insulative housing 91 and the lid 93, the lid 93 engages with the actuator 95 and is movably disposed on the insulative housing 91.

Then, in use the socket 9 is usually mounted on a printed circuit board of a testing equipment to test a package, during the test, heat produced by the package is intended to be dissipated by a particular heat sink module of the testing equipment. However, such heat sink module is suitable for automatic maneuvering, but not for manual operation.

Hence, a socket assembly with improved heat sink module is required to overcome the above-mentioned disadvantages of the related art.

SUMMARY OF THE INVENTION

An object of the present invention is to provide a socket assembly which has a heat sink module mounted on a socket thereof by manual operation.

To achieve the aforementioned object, a socket assembly, adapted for electrically connecting an IC package to a printed circuit board, comprises a socket and a heat sink module mounted on the socket. The socket comprises a base with a plurality of contact holes, a plurality of contacts received in the contact holes, a sliding board for supporting the IC package, and a lid mounted on the base. The sliding board movably sits on the base and defines a plurality of upper contact holes corresponding to the contact holes of the base to receive the contacts. The lid is operationally mounted to the base in a top-to-bottom direction, and defines an opening. The heat sink module comprises a fastening frame detachably mounted around a periphery of the socket; a cover pivotally assembled to the fastening frame with an end thereof and a heat sink, mounted on the cover. The cover is disposed with a latching member on an opposite end thereof, and the latching member latches with the lid when the cover is located above the lid of the socket. The heat sink is able to extend through the opening of the lid to press against the IC package received in the socket.

Other objects, advantages and novel features of the invention will become more apparent from the following detailed description of a preferred embodiment when taken in conjunction with the accompanying drawings.

DETAILED DESCRIPTION OF THE INVENTION

Referring to FIG. 3 to FIG. 6, the socket assembly 100 is provided to test an IC package (not shown), and comprises a socket 200 and a heat sink module 300 detachably assembled to the socket 200. The socket 200 includes a square base 1, a sliding board 2 mounted on the base 1 and capable of horizontally sliding relative to the base 1, a lid 3 mounted on the base 1 and movable with respect to the base 1 in a top-to-bottom direction, an actuator 4 disposed between the base 1 and the sliding board 2 and a back plate 5 disposed below the base 1.

Figure 6:
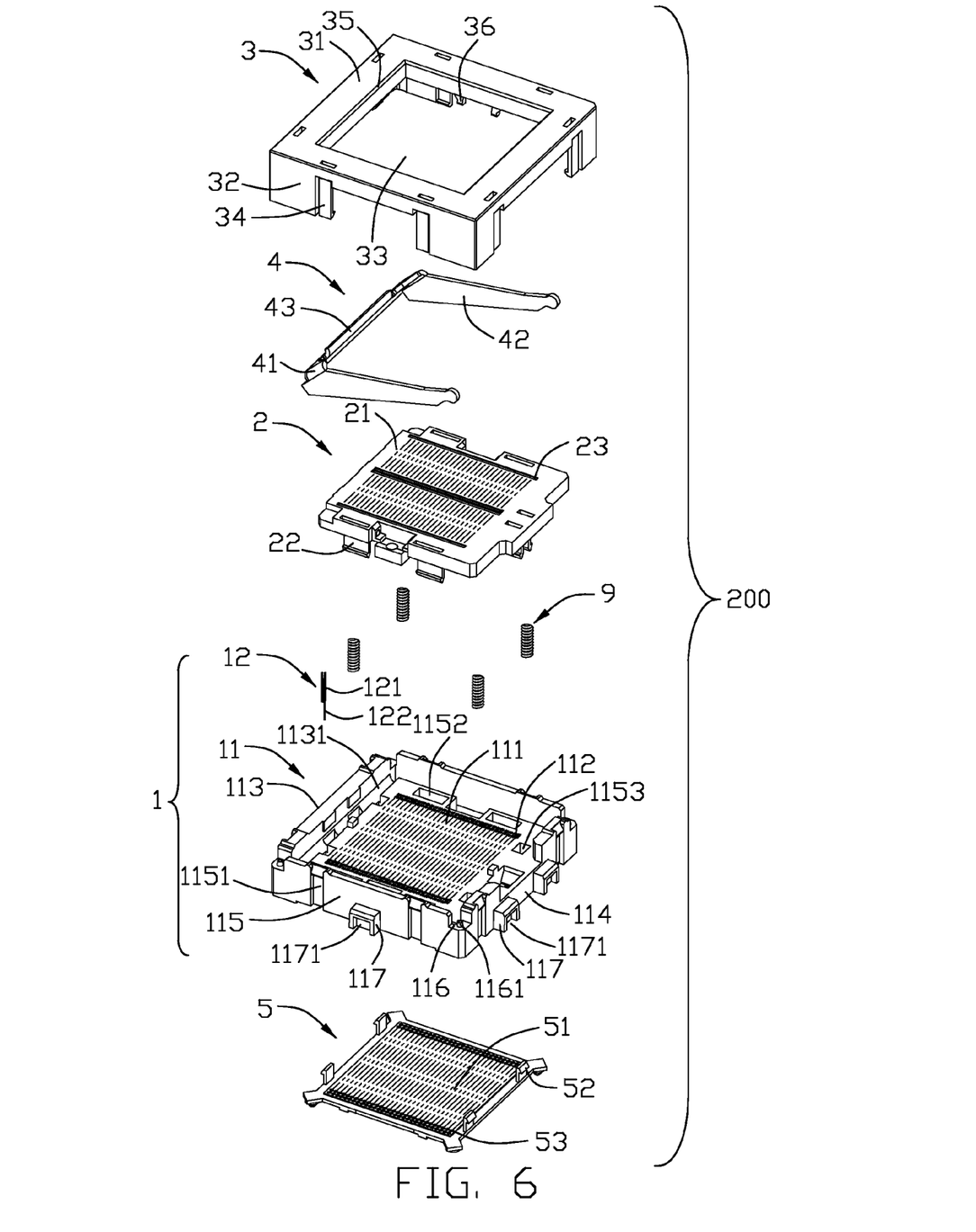
FIG. 6 is an exploded, perspective view of a socket of the socket assembly in accordance with the preferred embodiment of present invention.

The base 1 comprises an insulative housing 11 and a plurality of contacts 12 accommodated in the housing 11. The base 11 is formed with a board-like conductive area 111 in a center thereof with a plurality of contact holes 112 for receiving and retaining the contacts 12. The conductive area 111 is surrounded by a front end 113, a rear end 114, a pair of lateral ends 115. The housing 11 has two separated latching slots 1151 on each outside surface thereof. A stair portion 116 is provided on each corner of the housing 11, and a taper post 1161 extends from the bottom of the stair portion 116.

Each lateral end 115 defines two spaced first receiving grooves 1152 adjacent to the conductive area 111, each of the front end 113 and the rear end 114 defines two spaced second receiving grooves 1153 which extend through the housing 11 along the top-to-bottom direction and is located near the conductive area 111. The lateral end 115 has a projection 117 protruding from the outside surfaces thereof, and the rear end 114 has another two spaced projections 117 protruding from the outside surface thereof, each projection 117 defines a recess 1171 in a center thereof.

The sliding board 2 has a substantial board shape, and is dimensioned slightly larger than that of the conductive area 111 of the base 1 and is mounted against the conductive area 111. The sliding board 2 has a main body 21 with two clasps 22 extending downwardly from two sides of the main body 21. The main body 21 has a plurality of upper contact holes 23 corresponding to the contact holes 112 of the base 1 for two arms 121 of the contact 12 passing through. When the sliding board 2 is mounted on the base 1, the clasps 22 are inserted within the first receiving grooves 1152 respectively, and can horizontally slide a certain distance in the first receiving grooves 1152.

The lid 3 is assembled on top of the base 1, and comprises a top wall 31 and four side walls 32 extending downwardly from the top wall 31, an open 33 defined in a center thereof aligning with the main body 21 of the sliding board 2, the IC package (not shown) can pass through the opening 33 to seat on the main body 21 of the sliding board 2. Each of the side walls 32 has two claws 23 engaging with the latching slots 1151 of the base 1 and being able to slide in the latching slots 1151 of the base 1 in the top-to-bottom direction. The top wall 31 has four blind holes (not shown) on four corners of the bottom thereof, a plurality of springs 9 are disposed between the blind holes (not shown) and the stair portions 116, so that the lid 3 can move relative to the base 1 in the top-to-bottom direction.

The opening 33 has chamfers on inner sides thereof which defines an inclined guiding surface 35 for the heat sink module 300. The top wall 31 has two abutting portion 36 extending downwardly from a bottom part of two opposite sides thereof to abut against the actuator 4, when the lid 3 is downwardly depressed, the sliding board 2 can be triggered to move horizontally with respect to the base 1 by the abutting portion 36 of the lid 3, causing the actuator 4 to rotate accordingly The actuator 4 is disposed between the base 1 and the lid 3, according to the preferred embodiment, the actuator 4 is mounted on the base 1 and comprises an actuating body 41 in a center thereof and two actuating arms 42 aslant extending upwardly from two ends of the actuating body 41. The actuating body 41 is received in a channel 1131 defined on the front end 113 of the housing 11, and has an arch elastic piece 43 protruding toward the conductive area 111 of the housing 11 from a middle part thereof. The actuating arms 42 are parallel to the lateral ends 15 of the housing 11 and extend to an area under the abutting portions 36 of the lid 3. When the lid 3 will pressed downwardly, the abutting portions 36 of the lid 3 abut against the actuating arms 42 of the actuator 4, so that the actuating body 41 is forced to rotate in the channel 1131 of the housing 11, and the elastic piece 43 of the actuating body 41 pushes the sliding board 2 to slide along the base 1 to an opened position.

The back plate 5 is mounted below the base 1 to protect tails 122 of the contacts 12. The back plate 5 includes a horizontal board portion 51, which defines a plurality of lower contact holes 53 corresponding to the contact holes 112 of the housing 11, and two hook portions 52 extending upwardly from two ends of the board portion 51. The hook portions 52 insert into and latch with the second receiving grooves 1153 of the housing 11, when the back plate 5 is mounted below the base 1.

Figure 4:
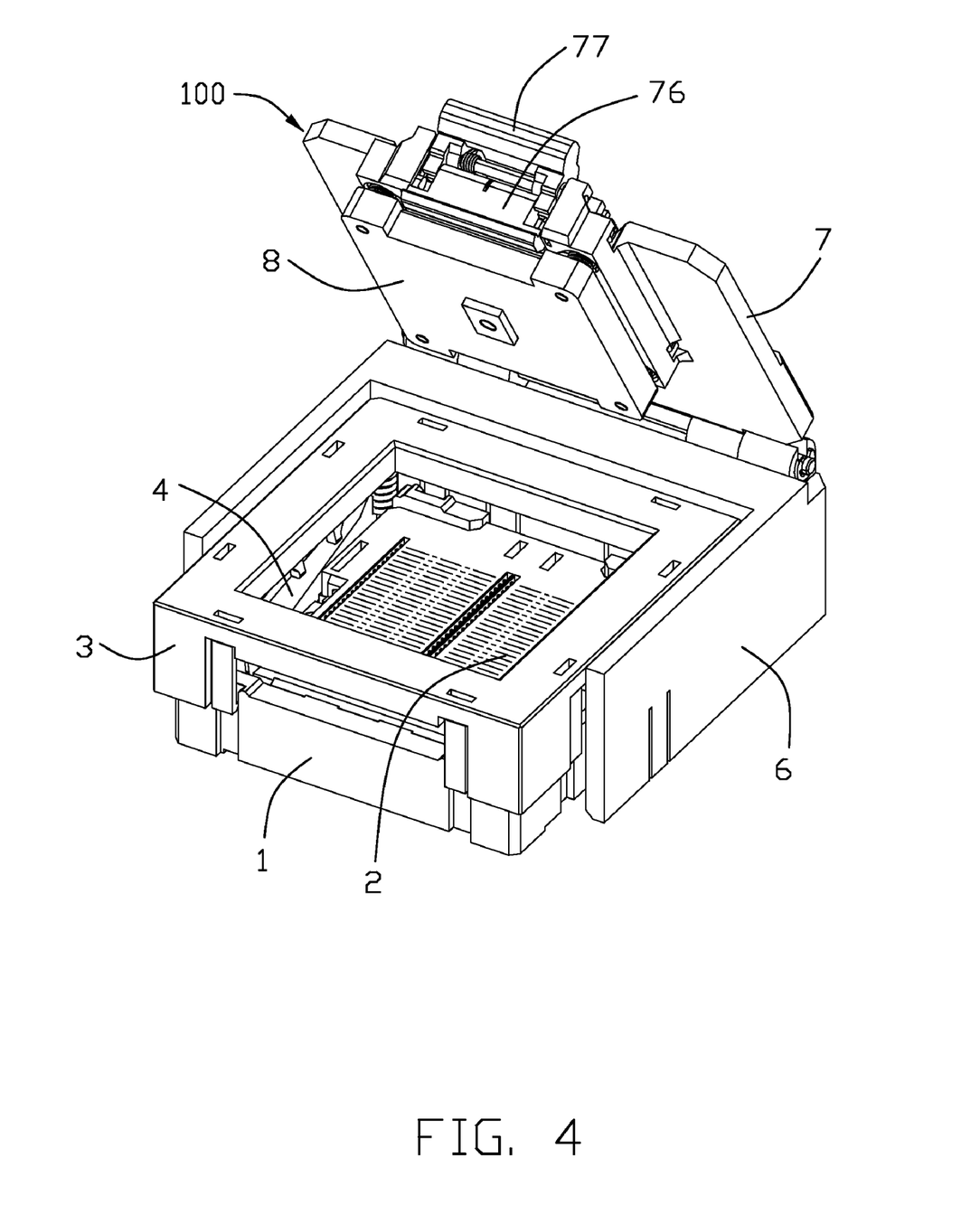
FIG. 4 is another assembled, perspective view of the socket assembly, wherein the heat sink is located in a half-opened position.
Figure 5:
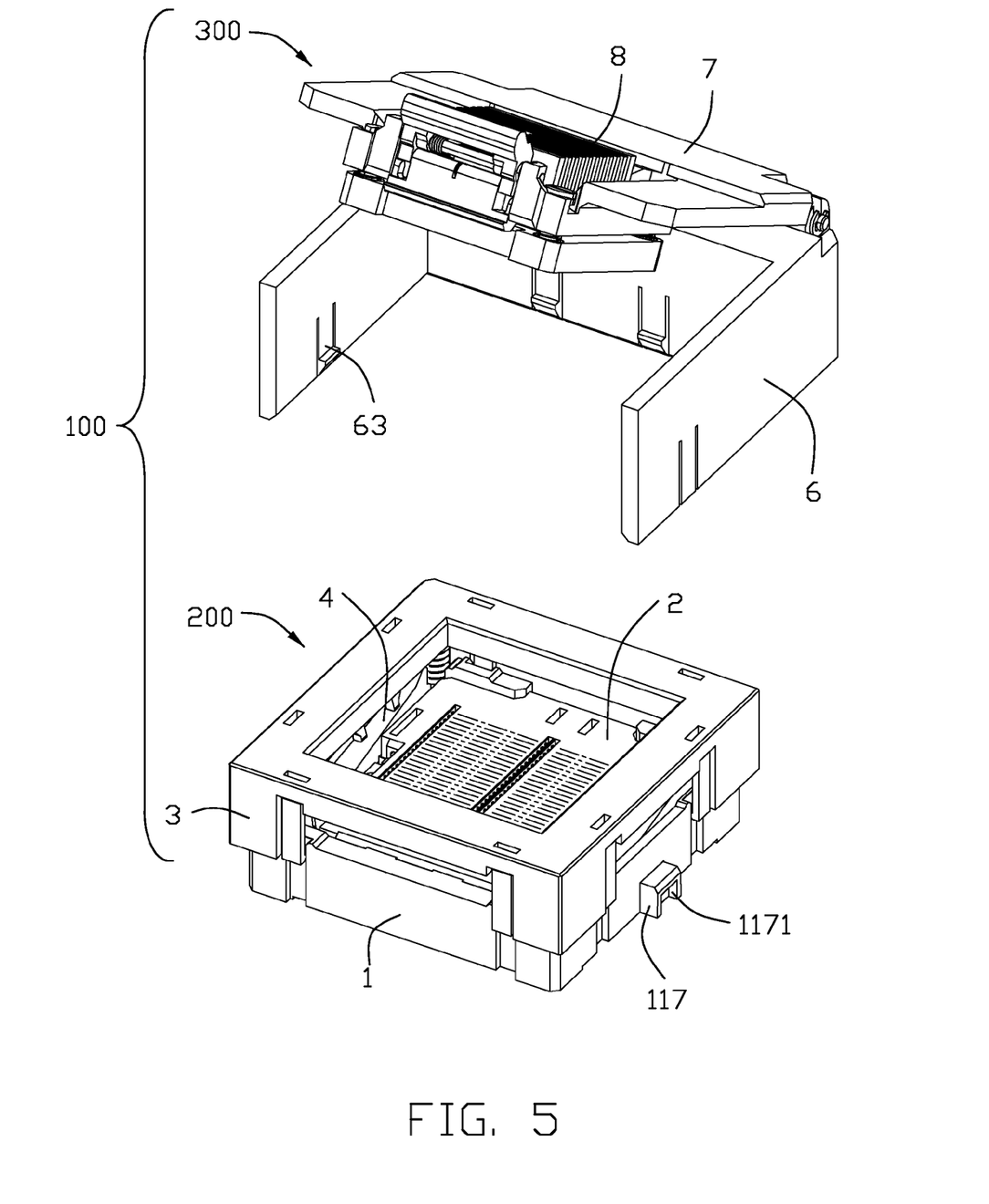
FIG. 5 is a partially assembled, perspective view of the socket assembly, wherein the heat sink module is not assembled to the socket.
Figure 7:
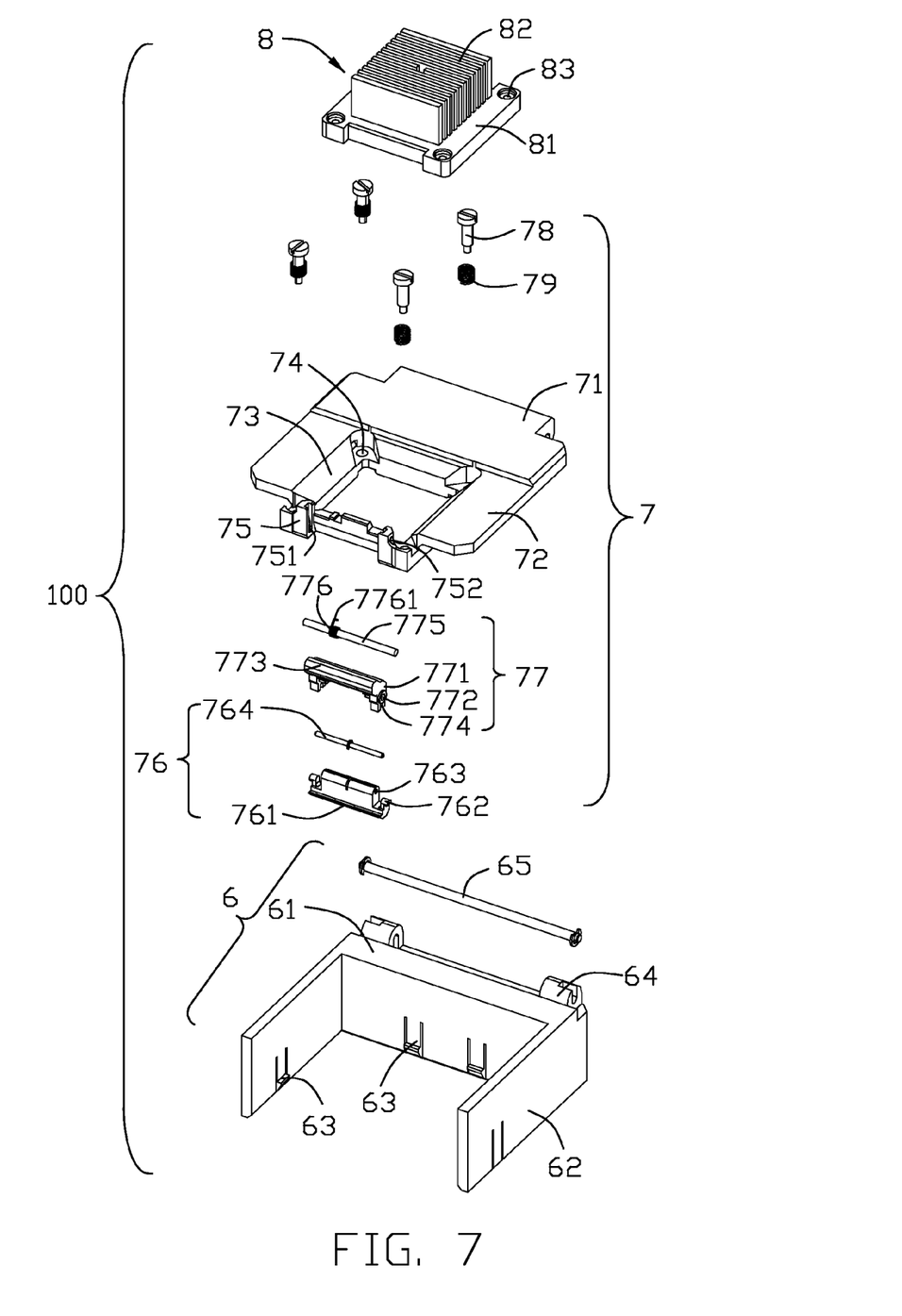
FIG. 7 is an exploded, perspective view of a heat sink module of the socket assembly in accordance with the preferred embodiment of present invention.

Referring to FIG. 4, FIG. 5 and FIG. 7, the socket assembly 100 comprises a heat sink module 300 which can be manually mounted on the socket 200, the heat sink module 300 can sit against the IC package (not shown) and latch with the lid 3. In present embodiment, the heat sink module 300 has a fastening frame 6 detachably mounted around a periphery of the base 1 of the socket 200, a cover 7 pivotally assembled to the fastening frame 6 and a heat sink 8 mounted on the cover 7. The heat sink 8 has a board-like body 81 and a plurality of cooling fins 82 extending from a center of the body 81, the body 81 has four threaded holes 83 on four corners thereof.

The fastening frame 6 surrounds the periphery of the base 1 of the socket 200, and has an U-shaped configuration with a pivoting edge 61 in a middle thereof and two lateral edges 62 extending from two ends of the pivoting edge 61. The pivoting edge 61 has two hook-like latching portions 63 corresponding to the projections 117 of the housing 11, the lateral edges 62 each has an additional latching portion 63. When the fastening frame 6 is mounted around the base 1, the latching portions 63 are received in the recesses 1171 of the projections 117, respectively, to attach the fastening frame 6 to the base 1. The pivoting edge 61 has two spaced ears 64 protruding upwardly from the top thereof with a pivotal shaft 65 assembled between the ears 64.

The cover 7 pivotally assembles to the pivoting edge 61 of the fastening frame 6 by an end thereof, and is able to rotate between an opened position and a closed position. The cover 7 being a plane configuration, has a pivoting end 71 through which the pivotal shaft 65 of the fastening frame 6 passes, and a casting 72 surrounding the heat sink 8.

The casting 72 has four sides 73, which surround the cooling fins 82 of the heat sink 8 and define a plurality of through holes 74 corresponding to the threaded holes 83 of the heat sink 8. The cover 7 has two vertical extending fixing posts 75 on one of the sides 73 opposite to the pivoting edge 71, a rotatable latching member 76 and a rotatable operating member 77 are assembled spatially between the fixing posts 75. Four linking portions 78 pass through the through hole 74 of the cover 7 to engage with the threaded holes 83 of the heat sink 8. Furthermore, a plurality of springs 79 is mounted on the linking portions 78 and between the cover 7 and the heat sink 8, so that the heat sink 8 is fastened to the cover 7 and can move relative to the cover 7 in the top-to-bottom direction.

The latching member 76 is pivotally assembled between the two fixing posts 75, and has a catch 761 for latching with the top wall 31 of the lid 3 on a tail thereof and two pivoting portions 762 protruding outwardly from two ends thereof. The latching member 76 defines a aperture 763 in the top thereof, an actuating pole 764 passes through the aperture 763 with two ends thereof extending beyond the aperture 763. The operating member 77 is also pivotally assembled between the two fixing posts 75 and is located over the latching member 76. The operating member 77 has an essential body 771 with two through holes 772, a board-like handle 773 aslant extending from a top of the essential body 771 and two n-shaped latching notches 774 extending downwardly from two ends of the essential body 771. The through holes 772 receive a shaft 775.

When the latching member 76 and the operating member 77 are installed on the cover 7, the pivoting portions 762 of the latching member 76 are received in two lower bores 751 defined on the fixing posts 75 of the cover 7; the operating member 77 can rotate around the shaft 775; two ends of the actuating pole 764 of the latching member 76 are received in the latching notches 774 of the operating member 77, so when the operating member 77 rotates, the latching notch 774 engages with the actuating pole 764 and brings the latching member 76 to rotate.

Furthermore, the operating member 77 has a compressed member 776, which rings the shaft 775 of the operating member 77 and has two elastic fingers 7761 which form an angle therebetween. The elastic fingers 7761 abut against the side 73 and the essential body 771 of the operating member 77, so the latching member 6 is kept in an upright direction without rotation when no outside force acts on the operating member 77.

Referring to FIG. 6, the socket 200 of the socket assembly 100 and a heat sink module 300 are assembled separately, when the socket 200 is assembled, the sliding board 2 is mounted on the base 1, then, the actuator 4 is assembled on the base 1, then the springs 9 and the lid 3 are installed to the base 1, the back plate 7 is secured under the base 1 from bottom to top. When the lid 3 is pressed and moves downwardly with a certain distance, the abutting portions 36 of the lid 3 press the actuating arms 42 of the actuator 4 and bring the sliding board 2 to horizontally slide relative to the base 1 to the opened position. At this moment, the arms 121 of the contact 12 is located in an opened state, the IC package (not shown) can pass through the opening 33 of the cover 3 and sit on the main body 21 of the sliding board 2. When the outside force is released, the sliding board 2 returns to original position by restoring force of the arms 121 of the contact 12, and then the arms 121 of the contact 12 clasp a solder ball of the IC package (not shown) to electrical connect with the IC package (not shown). When the heat sink module 300 is assembled, the cover 7 is pivotally assembled to the fastening frame 6, and then the heat sink 8 is seated on the cover 7 by the linking member 78.

Referring to FIG. 3, FIG. 5, FIG. 8 and FIG. 9. the heat sink module 300 of the socket assembly 100 can be manually operated to dissipate heat-buildup from the IC package (not shown). During field application, the socket 200 is mounted on a testing printed circuit board (not shown), then the fastening frame 6 of the heat sink module 300 surrounds the periphery of the base 1 of the socket 200, and the assembly of the socket assembly 100 is completed.

Figure 8:
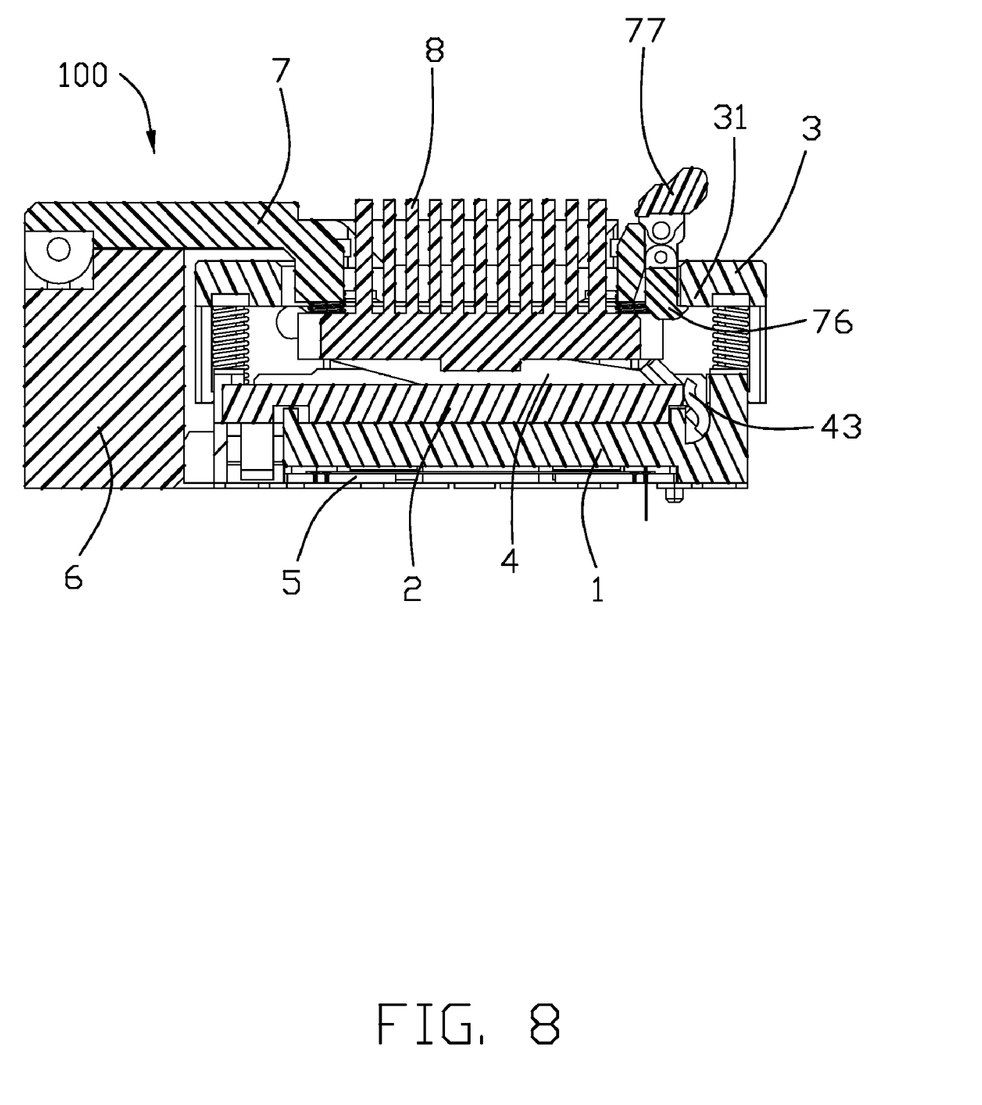
FIG. 8 is a section view of the socket assembly along line 8-8 in FIG. 3.
Figure 9:
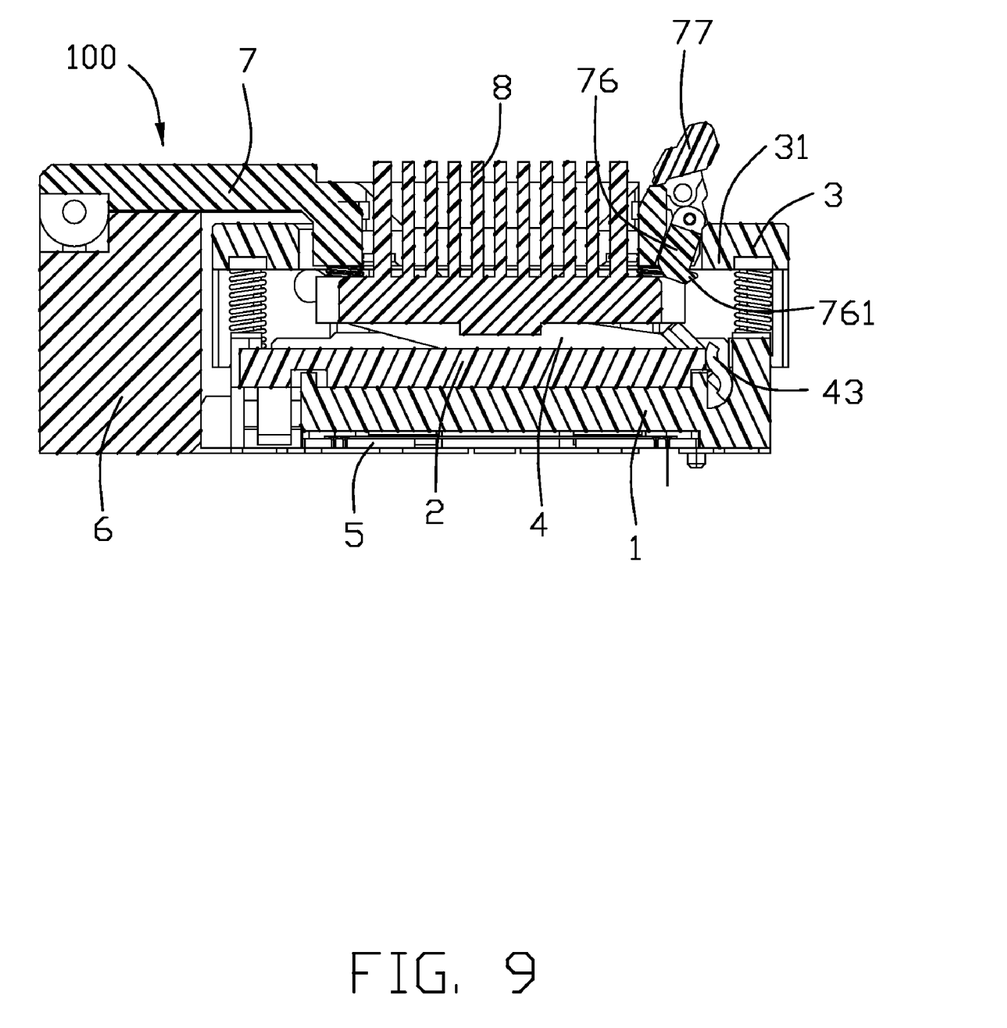
FIG. 9 is another section view of the socket assembly, showing another state of the socket assembly.

When testing the IC package, the handle 773 of the operating member 77 is operated by an external force to make the operating member 77 rotate outwardly, then the outwardly rotating operating member 77 brings the catch 761 of the latching member 76 to rotate inwardly to avoid an edge of the top wall 31 of the lid 3. So that the cover 7 can continue to rotate continuously and downwardly, the latching member 76 slides downwardly along the guiding surface 35 till a bottom of the body 81 of the heat sink 8 of the heat sink module 300 abuts against a top surface of the IC package (not shown), that means the cover 7 reaches to the closed position. Then, the outside force is released, then latching member 76 follows the operating member 77 which is forced by the compressed member 776 to return to original position, to the upright direction, the catch 761 upwardly abuts against the top wall 31 of the lid 3. After that, the heat sink module 300 passes through the opening 33 of the lid 3 from a top side and sit on the IC package (not shown), thereby the heat sink module 300 can disperse the heat on the IC package (not shown).

After the IC package (not shown) is tested, the handle 773 is operated to force the operating member 77 to rotate outwardly again, that in turn brings the latching member 76 to rotate inwardly, thereby the catch 761 of the latching member 76 leaves from the top wall 31 of the base 1, and then the cover 7 is rotated to the opened position to separate the heat sink 8 from the IC package (not shown).

The socket assembly 100 of present invention with a heat sink 300 can be easily assembled by manual operation, as a result, additional heat sink assembly which is equipped as a part of the testing equipment is not needed, this can reduce a cost of the socket assembly 100.

However, the disclosure is illustrative only, changes may be made in detail, especially in matter of shape, size, and arrangement of parts within the principles of the invention.

What is claimed is:

1. A socket assembly, adapted for electrically connecting an IC package to a printed circuit board, comprising:
    a socket comprising:
        a base having a plurality of contact holes;
        a plurality of contacts received in the contact holes;
        a sliding board for supporting the IC package, the sliding board movably seating on the base and defining a plurality of upper contact holes corresponding to the contact holes of the base to receive the contacts; and
        a lid mounted on the base and being movable with respect to the base in a top-to-bottom direction, the lid defining an opening; and
    a heat sink module, comprising:
        a fastening frame detachably mounted around a periphery of the socket;
        a cover pivotally assembled to the fastening frame with an end thereof and disposed with a latching member on an opposite end thereof, the latching member engaging with the lid when the cover is located above the lid of the socket; and
        a heat sink, mounted on the cover and capable of extending through the opening of the lid to abut against the IC package received in the socket.

2. The socket assembly as claimed in claim 1, wherein the base has a plurality of projections on outside surfaces thereof, each projection defines a recess, the fastening frame of the heat sink module has a plurality of latching portions latching with the recesses.

3. The socket assembly as claimed in claim 1, wherein the latching member is pivotally assembled to the cover, the heat sink module has an operating member pivotally assembled to the cover and located over the latching member, the operating member has a handle, when the handle rotates, the operating member can bring the latching member to rotate to be released from the lid.

4. The socket assembly as claimed in claim 3, wherein the latching member has a catch latching with a top wall of the lid and two pivoting portions protruding outwardly from two ends thereof, an actuating pole is assembled to another end of the latching member opposite to the catch, the operating member has two latching notches extending downwardly from an end thereof opposite to the handle, two ends of the actuating pole is received in the notches, so that the operating member can bring the latching member to rotate by engagement between the notches and the actuating poles.

5. The socket assembly as claimed in claim 4, wherein the operating member has a compressed member which can keep the latching member standing in an upright direction when no outside force exerts on the handle.

6. The socket assembly as claimed in claim 1, wherein a plurality of springs are disposed between the cover and the heat sink, so that the heat sink can move relative to the cover in the top-to-bottom direction.

7. The socket assembly as claimed in claim 6, wherein the heat sink has a board-like body and a plurality of cooling fins extending from the body, the cover surrounds a periphery of the cooling fins, the cover connects to the body of the heat sink by a plurality of linking members on which the springs are disposed.

8. The socket assembly as claimed in claim 6, wherein the lid has a guiding surface on inner sides thereof to guide the latching member of the cover.

9. The socket assembly as claimed in claim 6, wherein the socket further comprises an actuator disposed between the lid and the base, when the lid is pressed downwardly, the actuator can force the sliding board to slide with respective to the base.

10. The socket assembly as claimed in claim 9, wherein the actuator has an actuating body and two actuating arms aslant extending from two ends of the actuating body, the actuator is mounted on the base beside the sliding board, when the lid moves downwardly, the lid actuates the two actuating arms to rotate, then the actuator drives the sliding board to horizontally move along the base.

11. A socket assembly, comprising:
a socket received with a plurality of contacts;
a heat sink module mounted on the socket, and comprising:
a fastening frame, detachably mounted around the socket of the socket assembly;
a cover, having an end pivotally assembled to the fastening frame, and another end assembled with a latching member, the latching member of the cover latching with the socket when the cover rotates a closed position; and
a heat sink, mounted on the cover and moving along with the cover to abut against an IC package received in the socket.

12. The heat sink module as claimed in claim 11, wherein the fastening frame has a plurality of latching portions which engage a periphery of the socket.

13. The heat sink module as claimed in claim 11, wherein the latching member is pivotally assembled to the cover, an operating member is pivotally assembled to the cover and is located over the latching member, the operating member has a handle, the operating member can force the latching member to rotate and leave from the lid by outwardly rotating the handle.

14. The heat sink module as claimed in claim 13, wherein the latching member has a catch latching with a top wall of the lid and two pivoting portions protruding outwardly from two ends thereof, an actuating pole is assembled to another end thereof opposite to the catch, the operating member has two latching notches extending downwardly from an end thereof opposite to the handle, two ends of the actuating pole is received in the notches, so that the operating member can bring the latching member to rotate by engagement between the notches and the actuating pole.

15. The heat sink module as claimed in claim 14, wherein the operating member has a compressed member which can keep the latching member standing in the upright direction when no outside force exits.

16. The heat sink module as claimed in claim 11, wherein a plurality of springs are disposed between the cover and the heat sink, so that the heat sink can move relative to the cover in the top-to-bottom direction.

17. A socket assembly comprising:
a socket and a heat sink module cooperating with each other,
said socket including:
an insulative base defining a first opening for receiving an electronic package, and a lid assembled upon the base and moveable relative the base in a vertical direction and further defining a second opening in alignment with the first opening;
a plurality of contacts disposed in the base;
a set of first springs urging the lid upwardly away from the base;
said heat sink module including:
a cover moveable relative to the base in a pivotal manner; and
a heat sink moveable along with the cover in said pivotal manner and received in the second opening for mechanical and thermal engagement with the electronic package when the cover is latched to the socket.

18. The socket assembly as claimed in claim 17, wherein said cover is latched to the lid of the socket.

19. The socket assembly as claimed in claim 17, wherein said cover is equipped with a set of second springs to urge the heat sink toward the base.

20. The socket assembly as claimed in claim 17, wherein said heat sink module further includes a frame fastened to the base under condition that the cover is pivotally fastened to the frame.

* * * * *